(12) United States Patent
Awadalla

(10) Patent No.: US 11,539,447 B2
(45) Date of Patent: Dec. 27, 2022

(54) SUBCARRIER BASED ADAPTIVE EQUALIZATION OF ELECTRICAL FILTERING EFFECTS ON SUB-CARRIER MULTIPLEXED SIGNALS

(71) Applicant: Infinera Corporation, Sunnyvale, CA (US)

(72) Inventor: Ahmed Awadalla, Gatineau (CA)

(73) Assignee: Infinera Corporation, San Jose, CA (US)

( * ) Notice: Subject to any disclaimer, the term of this patent is extended or adjusted under 35 U.S.C. 154(b) by 0 days.

(21) Appl. No.: 16/254,552

(22) Filed: Jan. 22, 2019

(65) Prior Publication Data

US 2019/0268076 A1   Aug. 29, 2019

Related U.S. Application Data

(60) Provisional application No. 62/619,129, filed on Jan. 19, 2018.

(51) Int. Cl.
*H04J 4/00* (2006.01)
*H04B 10/69* (2013.01)
*H03H 17/06* (2006.01)

(52) U.S. Cl.
CPC ......... *H04B 10/6971* (2013.01); *H03H 17/06* (2013.01); *H03H 2218/06* (2013.01); *H03H 2218/085* (2013.01)

(58) Field of Classification Search
CPC .............. H04B 10/6161; H04B 10/614; H04B 10/616; H04B 10/60; H04B 10/61;
(Continued)

(56) References Cited

U.S. PATENT DOCUMENTS 9,749,060 B1 * 8/2017 Wang ................... H04B 10/614
2007/0115053 A1 * 5/2007 Vaisanen ................... H03F 3/19
330/124 R
(Continued)

*Primary Examiner* — Hibret A Woldekidan
(74) *Attorney, Agent, or Firm* — David L. Soltz

(57) ABSTRACT

Consistent with the present disclosure, the above-described subcarrier noise, which may be characterized as a linear filtering effect, may be reduced or eliminated by providing a first multiple-input multiple output (MIMO) circuits at the transmit end of an optical link and providing a second MIMO circuit at the receive end of the optical link. The first MIMO may include a first plurality of filters, each of which may include a finite-impulse response (FIR) filter having variable coefficients or tap weights that may be changed or adapted to minimize subcarrier noise associated with the modulator, as well as D/A and analog circuitry, at the transmit end of the optical link. In addition, the second MIMO may include a second plurality of filters, each of which may also include an FIR filter having variable coefficients or tap weights that may be changed or adapted to minimized subcarrier noise associated with the optical hybrids, as well as A/D and analog circuitry, at the receive end of the optical link. In one example, a least means square (LMS) technique may be employed to calculate desired coefficients or tap weights whereby an error determined based on the signal detected at the receiver is minimized to update the coefficients of the FIR filters.

19 Claims, 12 Drawing Sheets

(58) Field of Classification Search
CPC ............... H04B 10/6971; H04B 1/707; H04B 10/2507; H04B 10/505; H03H 17/06; H03H 2218/06; H03H 2218/085; H04J 14/0298; H04J 14/02; G02F 1/225
USPC .......................... 398/76, 183, 192, 193, 194
See application file for complete search history.

(56) References Cited

U.S. PATENT DOCUMENTS

| | | | | |
|---|---|---|---|---|
| 2011/0150478 | A1* | 6/2011 | Winzer | H04B 10/6971 398/65 |
| 2012/0148262 | A1* | 6/2012 | Awadalla | H04B 10/25137 398/193 |
| 2012/0288286 | A1* | 11/2012 | Houtsma | H04B 10/613 398/202 |
| 2014/0029957 | A1* | 1/2014 | Sethumadhavan | H04B 10/588 398/192 |
| 2016/0233963 | A1* | 8/2016 | Zhuge | H04B 10/2543 |
| 2017/0019203 | A1* | 1/2017 | Asm | H04B 10/61 |
| 2017/0179910 | A1* | 6/2017 | Gathman | H03F 1/26 |

* cited by examiner

SUBCARRIER BASED ADAPTIVE EQUALIZATION OF ELECTRICAL FILTERING EFFECTS ON SUB-CARRIER MULTIPLEXED SIGNALS

CROSS REFERENCE TO RELATED APPLICATION

This application claims the benefit of U.S. Provisional Patent Application No. 62/619,129, filed Jan. 19, 2018, which is incorporated by reference as if fully set forth.

BACKGROUND

Optical communication systems are known in which light output from a laser is modulated by an external modulator to provide a modulated optical signal carrying data in accordance with an analog or drive signal applied to the modulator. In certain optical communication systems, the modulated optical signal may include a plurality of subcarriers, each of which carrying different data. In addition, each subcarrier may be modulated to have both in-phase (I) and quadrature (Q) components, if coherent detection is employed. Digital signal processors (DSPs) may be employed the generate appropriate digital signals on the transmit side of the optical communication system and such transmit digital signals corresponding to the I and Q components are converted to corresponding analog signal by digital-to-analog (D/A) circuits. These analog signals may be further processed in analog circuitry, such as a driver circuit or digital-to-analog circuits, to provide the drive signals to the modulators.

On the receive end of the system, the modulated optical signals may be converted to corresponding electrical signals by one or more photodiodes after mixing with local oscillator light in an optical hybrid, for example. These electrical signals may be further processed by analog circuitry, such as a transimpedance amplifier. The processed analog signals may then be provided to other analog circuits, such as analog-to-digital (ND) circuits that supply corresponding digital signals to a receive-end DSP for further processing.

At high data or baud rates, e.g., rates greater than 16 Gbaud, any distortion, such as an impedance mismatch, variations, or differences in the paths traversed by electrical signals associated with the I and Q components in the A/D, D/A, transmit and/or receive analog circuits may result in noise observed in the optical subcarriers output from the modulators. Moreover, path differences between the I and Q optical components in the modulator and the optical hybrids may also result in noise in corresponding electrical signals at the receive end of the optical link. The path variations may be caused by process-related imperfections in the integrated circuits used in the A/D and D/A circuits, for example, as well as process-related variations in modulators and optical hybrids. The resulting optical subcarrier noise, therefore, may differ from one system to the next and is difficult to predict. Accordingly, conventional approaches, including complex adders or multipliers, may not effectively correct for such optical subcarrier noise.

SUMMARY

Consistent with the present disclosure, an apparatus is provided that comprises analog circuitry including first and second paths for carrying electrical signals associated with in-phase and quadrature components of an optical signal. In addition, a digital signal processor is provided that includes digital circuitry that corrects for impairments that would occur in the optical signal in the absence of the digital circuitry. The impairments are associated with at least a difference in a characteristic between the first and second paths.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the present disclosure and, together with the description, serve to explain the principles of the present disclosure.

DESCRIPTION OF THE EMBODIMENTS

Consistent with the present disclosure, the above-described subcarrier noise, which may be characterized as a linear filtering effect, may be reduced or eliminated by providing digital circuitry, such as a first multiple-input multiple output (MIMO) circuits at the transmit end of an optical link and providing additional digital circuitry, such as a second MIMO circuit at the receive end of the optical link.

The first MIMO may include a first plurality of filters, each of which may include a finite-impulse response (FIR) filter having variable coefficients or tap weights that may be changed or adapted to minimize subcarrier noise associated with the modulator, as well as D/A and analog circuitry, at the transmit end of the optical link. In addition, the second MIMO may include a second plurality of filters, each of which may also include an FIR filter having variable coefficients or tap weights that may be changed or adapted to minimized subcarrier noise associated with the optical hybrids, as well as A/D and analog circuitry, at the receive end of the optical link. In one example, a least means square (LMS) technique may be employed to calculate desired coefficients or tap weights whereby an error determined based on the signal detected at the receiver is minimized to update the coefficients of the FIR filters. As used herein, "subcarrier" may refer to a subcarrier in the optical domain as well as data or information associated with such subcarrier in the electrical domain.

Consistent with a further aspect of the present disclosure, in order to obtain optimal performance, an equalizer is further provided that may correct for optical impairments along the link. The equalizer may also include an FIR filter, however, selected taps or coefficients of the first and second MIMO circuits remain fixed and are not updated in order to readily update taps associated with the equalizer to have optimal values.

Reference will now be made in detail to the present exemplary embodiments of the present disclosure, examples of which are illustrated in the accompanying drawings. Wherever possible, the same reference numbers will be used throughout the drawings to refer to the same or like parts.

Figure 1:
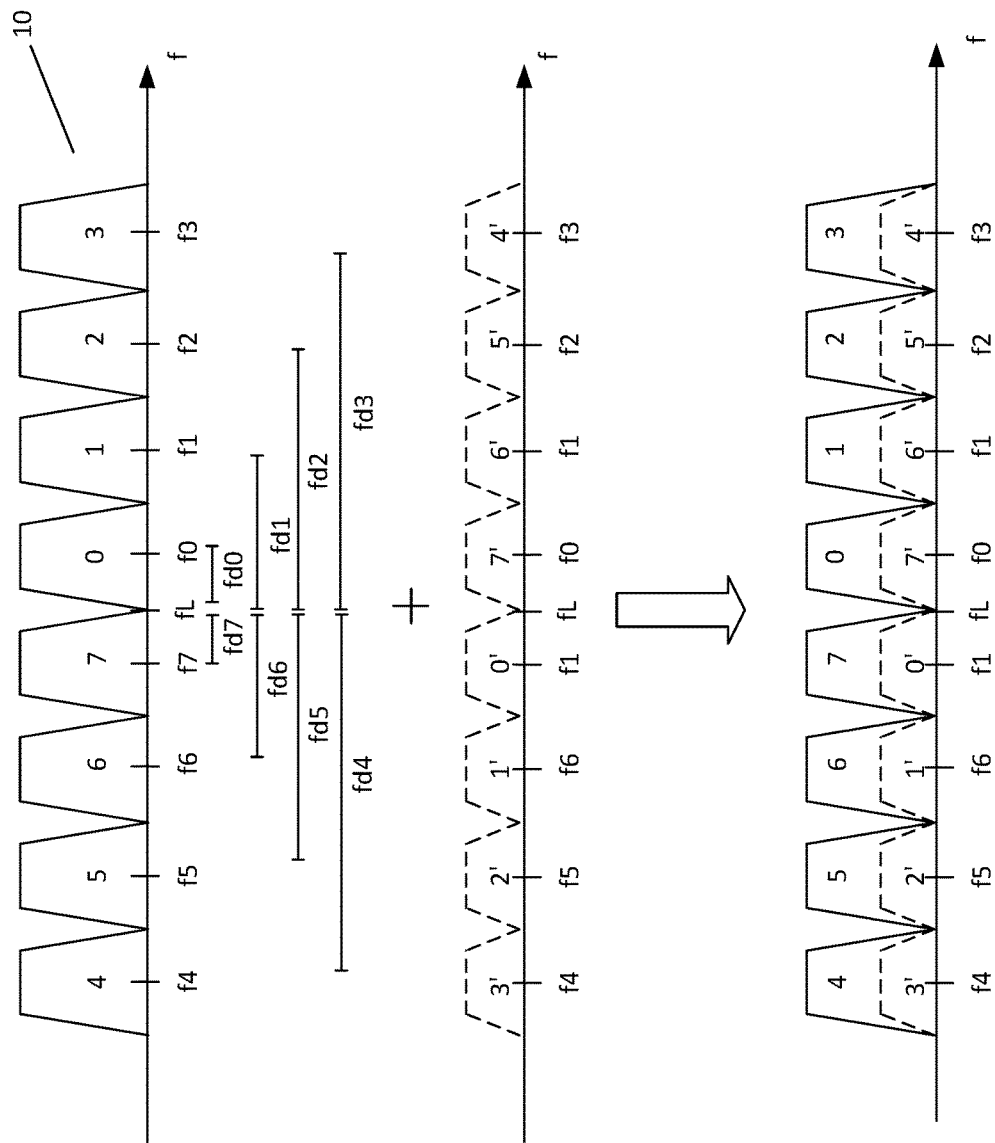
FIG. 1 illustrates subcarriers consistent with an aspect of the present disclosure.

FIG. 1 illustrates an example of subcarriers generated consistent with the present disclosure, as well as the above-described noise that may be observed in connection with such subcarriers. As noted above, light may be supplied from a laser to a modulator, which may be driven to output a modulated optical signal having a group of subcarriers 10. In the example shown in FIG. 1, subcarrier group 10 may include subcarriers 1 to 8, each having a respective one of frequencies 1 to 8. Namely, subcarriers 0 to 3 may have a corresponding one of frequencies f0 to f3. In addition, subcarriers 4-7 may have a corresponding one of frequencies f4 to f7. Each of frequencies f0 to f3 is provided above and spaced from laser frequency fL by a corresponding distance fd0 to fd3, and each of frequencies f4 to f7 is provided below and spaced from laser frequency fL by a respective one of distances fd4 to fd7. Frequencies f0 to f3 and frequencies f4 to f7 are symmetric about laser frequency fL, such that, in this example, fd0 equals fd7, fd1 equals fd6, fd2 equals fd5, and fd3 equals fd4. In one example, the subcarriers shown in FIG. 1 may be Nyquist subcarriers, each of which may have a frequency spacing equal to or slightly larger than the individual subcarrier baud-rate.

Due to the analog circuitry non-idealities noted above, each subcarrier may generate noise at an opposite frequency relative to the center laser frequency fL. Accordingly, as further shown in FIG. 1, subcarrier 3 at frequency f3 may have associated noise 3' at corresponding "negative" frequency f4, and subcarrier 4 at frequency f4 may generate noise 4' at corresponding negative frequency f3. Similarly, subcarriers 0, 1, and 2 may have associated respective noise 0', 1', and 2' at corresponding to "negative" frequencies f7, f6, and f5 opposite laser frequency fL. In addition, subcarriers 5, 6, and 7 may have associated respective noise 5', 6' and 7' at corresponding negative frequencies f2, f1, and f0. Such frequencies are termed "negative" frequencies with respect to frequencies f5, f6, and f7, respectively, because frequencies f2, f1, and f0 are opposite laser frequency fL.

As further shown, each of noise portions 3', 2', 1', 0', 7', 6', 5', and 4' may be added to and interfere with subcarriers 4, 5, 6, 7, 0, 1, 2, and 3, respectively, to thereby impair performance or increase errors in each of these subcarriers.

Figure 2A:
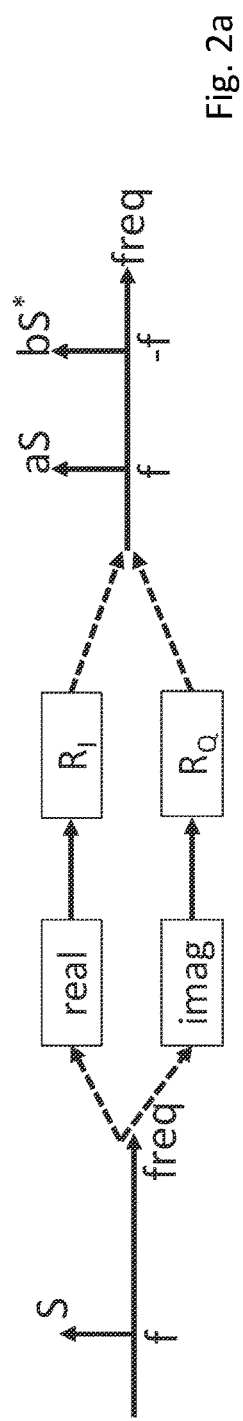
FIG. 2a illustrates a model that represents noise generation.

FIG. 2a graphically illustrates generally noise generation that may, in the examples presented herein, be addressed by the present disclosure. Subcarrier signal S at frequency f may include real and imaginary components corresponding to the I and Q components noted above, as further noted above, electrical signals corresponding to these components may traverse different high frequency (also referred to as radio frequency (RF)) paths represented by RI and RQ. The impairments, such as differences in characteristics of each path such as differences in length, impedance or impedance mismatches, associated with one of path, e.g. RI may be different than the impairments associated with the other path, e.g., RQ.

As a result, subcarrier S at frequency f may be distorted by a factor a, and an image of the subcarrier bS* or noise is generated the negative frequency (represented by −f) opposite laser frequency fL.

Figure 2B:
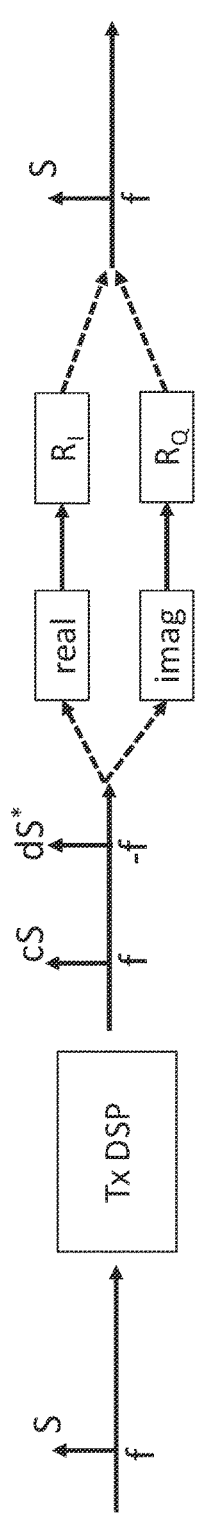
FIG. 2b illustrates a model by which noise generated in transmit side analog circuits may be reduced consistent with the present disclosure.
Figure 2C:
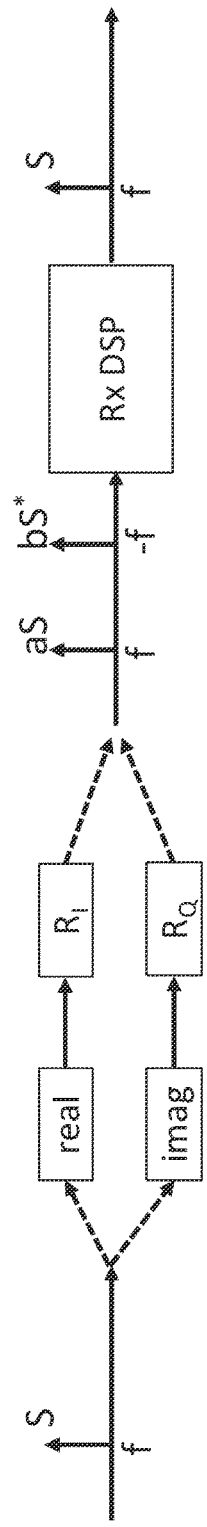
FIG. 2c illustrates a model by which noise generated in receiver side analog circuits may be reduced consistent with the present disclosure.

As shown in FIG. 2b, and consistent with the present disclosure, a transmit side DSP (TxDSP) may be provided that includes digital circuitry and outputs pre-compensating signals cS and dS* (c and d being factors, S representing the subcarrier signal, and S* representing a conjugate of the signal) at frequency f and the opposite or negative frequency −f, respectively. Such signals, in electrical form, effectively cancel out or reduce the effects of the path impairments and variations noted above.

Similarly, as shown in 2c, receive side DSP (RxDSP) may include digital circuitry and generate compensating signals which are factors of subcarrier S and the conjugate of S (S*) so that an undistorted signal S at frequency f without or substantially without noise at the opposite frequency.

Figure 3A:
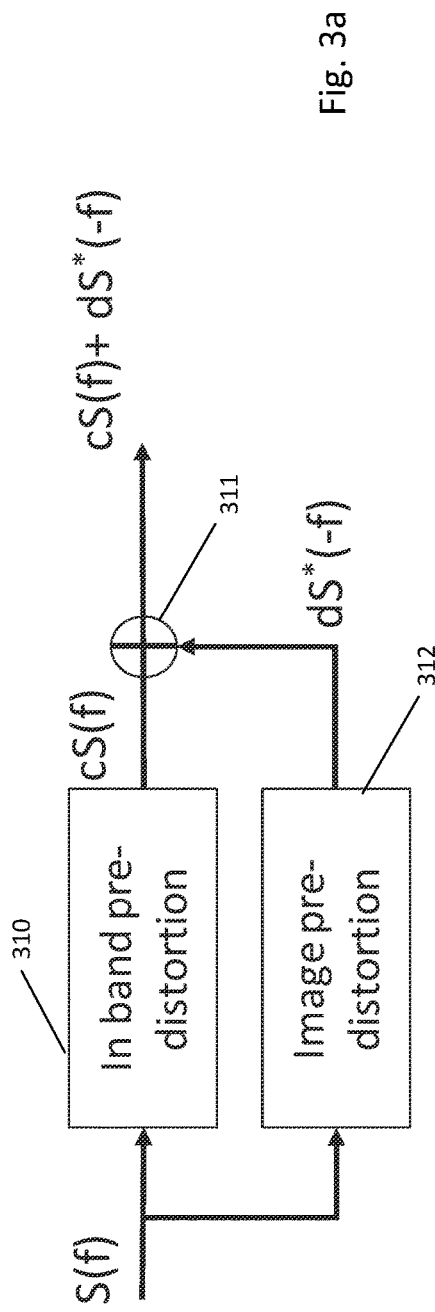
FIG. 3a illustrates in greater detail features shown in FIG. 2b.

FIG. 3a shows a block diagram that generally describes circuit blocks for generating compensating signals cS and dS* on the transmit side. Signal S at frequency f (denoted S(f)) in FIG. 3a) is subject to pre-compensation at frequency f (in-band, block 310) to provide signal S(f), pre-distorted by a factor c, i.e., signal cS. In addition, an image of the subcarrier signal, corresponding to the conjugate of S, S*, is pre-distorted by a factor d to provide signal dS*. As further shown in FIG. 3a, cS and dS* are effectively added (element 311) and, as noted above, these signals compensate or offset distortions in the subcarrier signal (aS(f)) at frequency f and the corresponding image at the negative frequency −f, bS*(−f).

Figure 3B:
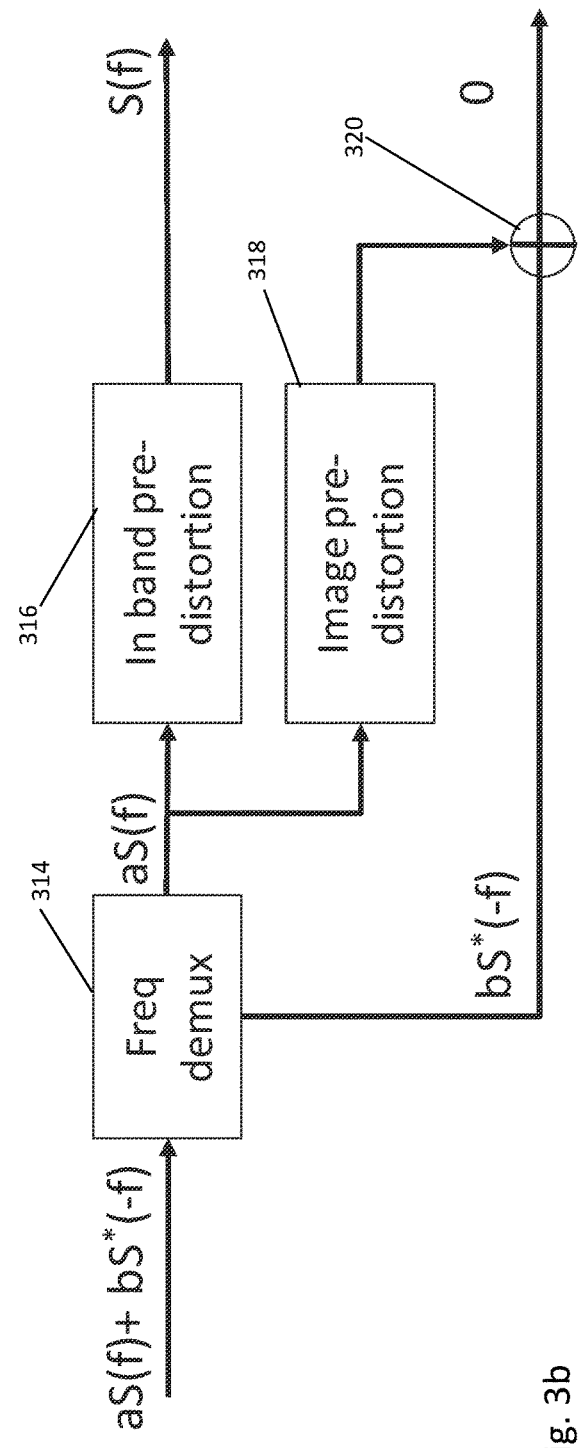
FIG. 3b illustrates in greater detail features shown in FIG. 2c.

FIG. 3b shows a block diagram that generally describes circuit blocks that correct (e.g., reduce or eliminate) or compensate for distorted signals aS and bS* in the receiver. Here, a composite distorted signal (aS(f)+bS*(−f)) is effectively frequency demultiplexed or split into separate components, aS(f) and bS*(−f). Signal aS(f) is subject to in-band pre-distortion at frequency f (block 316), similar to that described above to yield the desired subcarrier signal at frequency f (S(f)). Signal aS(f) compensates or corrects for the image signal at the negative frequency (−f) to provide a signal, which, when added (element 320) to signal bS*, cancels or offsets signal bS* per the "0" output of element 320. Accordingly, a corrected or compensated subcarrier signal is supplied that is free or substantially free of noise and does generate an associated image at a corresponding negative frequency that would otherwise interfere with a subcarrier at that negative frequency (e.g., subcarrier 3 at frequency f3 in FIG. 1 is free or substantially free of noise 4' generated as an image of subcarrier 4 at the negative frequency f3 associated with subcarrier 4).

Figure 4A:
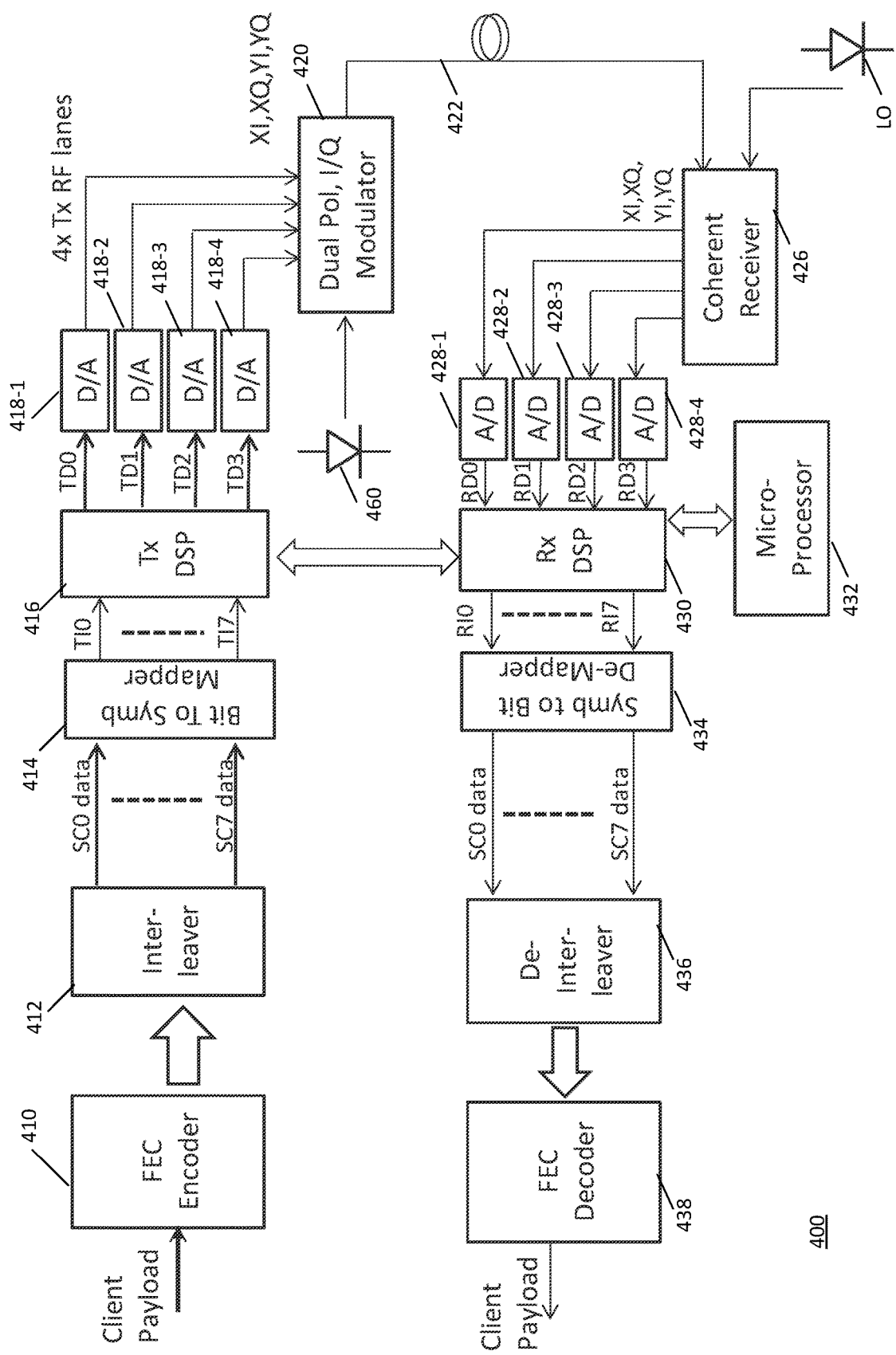
FIG. 4a illustrates a block diagram of an optical communication system consistent with an aspect of the present disclosure.

FIG. 4a illustrates a block diagram of an exemplary optical communication system 400 consistent with an aspect of the present disclosure that corrects for the impairments noted above. System 400 receives data or client payload information and such data is supplied to a forward error correction (FEC) encoder circuit that encodes the data in accordance with an FEC code. The encoded data may next be supplied to an interleaver circuit 412 that randomizes the data so that any errors that occur during transmission will be distributed upon de-interleaving (circuit 436) and will not be concentrated in a long stream, which otherwise may not be successfully corrected by the FEC decoder 438 in the receiver.

Interleaver circuit 412 supplies, in this example, output data streams SD0 to SD7, each of which being associated with a respective subcarrier. Output data streams SD0 to SD7 may next be provided to a bit-to-symbol mapper 414, which outputs symbol streams TI0 to TI7, such that each symbol in a given symbol stream corresponds to a particular bit sequence in a corresponding one of data streams SD0 to SD7. Symbol streams TI0 to TI7 are next input to transmit DSP (Tx DSP) 416, which is discussed in greater detail below. Tx DSP 416 may provide four outputs, each of which being supplied to a respective one of digital-to-analog (D/A) converters 418-1 to 418-4. Each of D/A converters 418-1 to 418-4 outputs a respective one of analog drive signals XI, XQ, YI, and YQ that drive a respective modulator.

It is understood that FEC encoder 410 may be a first FEC encoder and that an additional FEC encoder may be provided to encode a second data input. Moreover, an additional interleaver circuit may be provided to interleave the encoded data output from the additional encoder to output an additional eight data streams to another bit-to-symbol mapper, which, in turn, provides eight symbol streams (in addition to TI0 to TI7) in a manner similar to or the same as that described above with respect to bit-to-symbol mapper 414. Moreover, the Tx DSP may include a first portion or circuit that provides the first (TD0) and second (TD1) outputs to D/A converters 418-1 and 418-2 based on symbol streams TI0 to TI7, respectively, and a second portion or circuit that outputs third (TD2) and fourth (TD3) outputs to D/A converters 418-3 and 418-4.

Figure 4B:
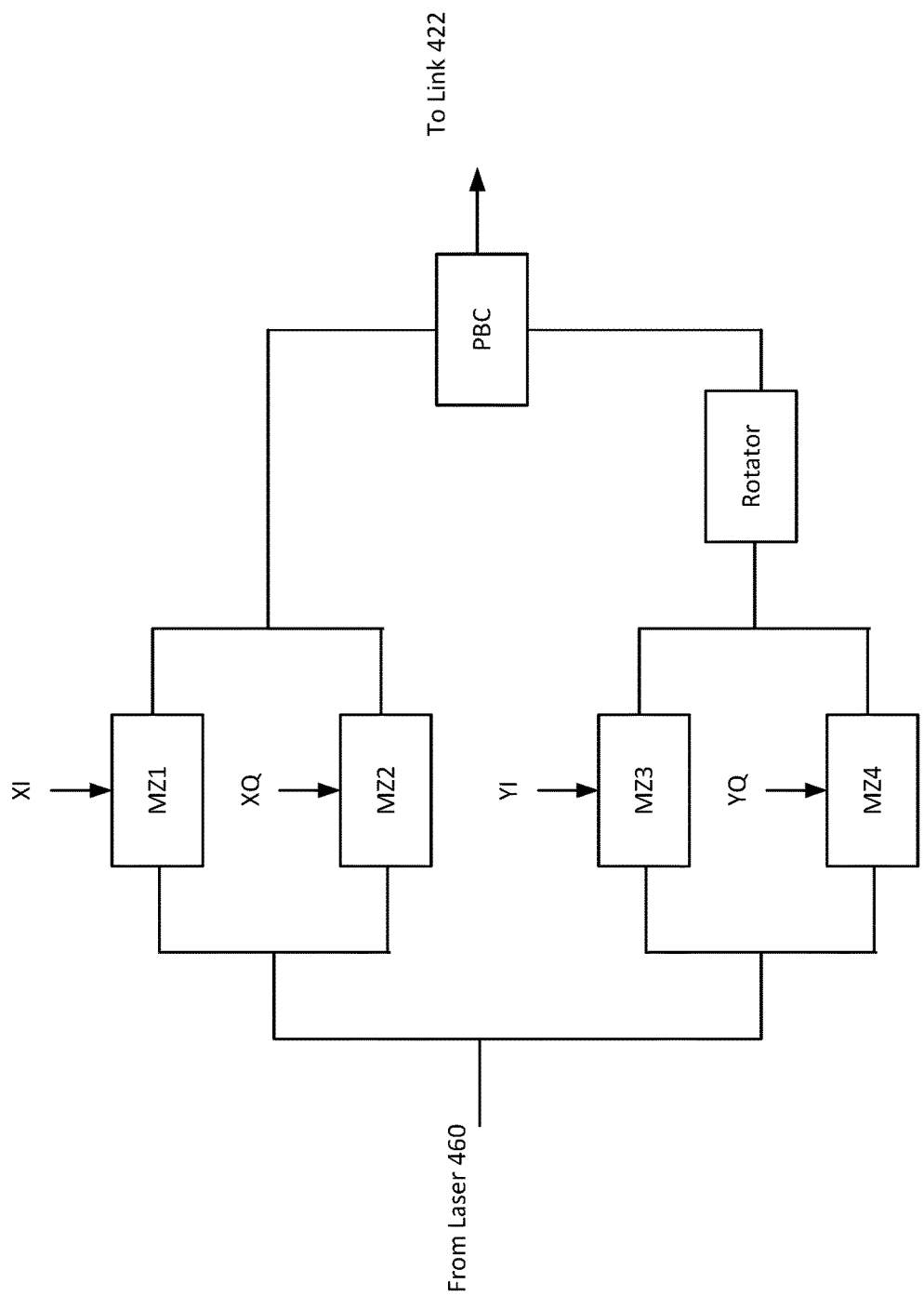
FIG. 4b illustrates an optical modulator circuit consistent with an additional aspect of the present disclosure.

For example, as shown in FIG. 4b, each of analog drive signals XI, XQ, YI, and YQ is supplied to a corresponding one of modulators MZ1, MZ2, MZ3, and MZ4, each of which may include a Mach-Zehnder modulator. Light from laser 460 is split and a first portion of such light is supplied to modulators MZ1 and MZ2. The first portion of the light is further split such that part of the first portion of the light is supplied to modulator MZ1 to modulate the first part of the light to provide an in-phase component, for example, and another part of the first portion of the light is supplied to modulator MZ2, which modulates the other part of the first portion of the light to provide a quadrature component. The in-phase and quadrature components are then combined and supplied to a polarization beam combiner.

In addition, a second portion of the light output from laser 460 is supplied to modulators MZ3 and MZ4, which may also include Mach-Zehnder modulators. The second portion of the light is further split such that part of the second portion of the light is supplied to modulator MZ3 to modulate the first part of the light to provide an in-phase component, for example, and another part of the second portion of the light is supplied to modulator MZ4, which modulates the other part of the second portion of the light to provide a quadrature component. The in-phase and quadrature components are then combined, and the polarization thereof is rotated, for example, by 90 degrees, such that the combined in-phase and quadrature components have a transverse magnetic (TM) polarization, whereas the combined in-phase and quadrature components of the first portion of the light typically have a transverse electric polarization. The TM light is also supplied to the polarization beam combiner, which combines the TE modulated light and the TM modulated light into a polarization multiplexed signal and supplies such signal to optical communication path or link 422.

Figure 4C:
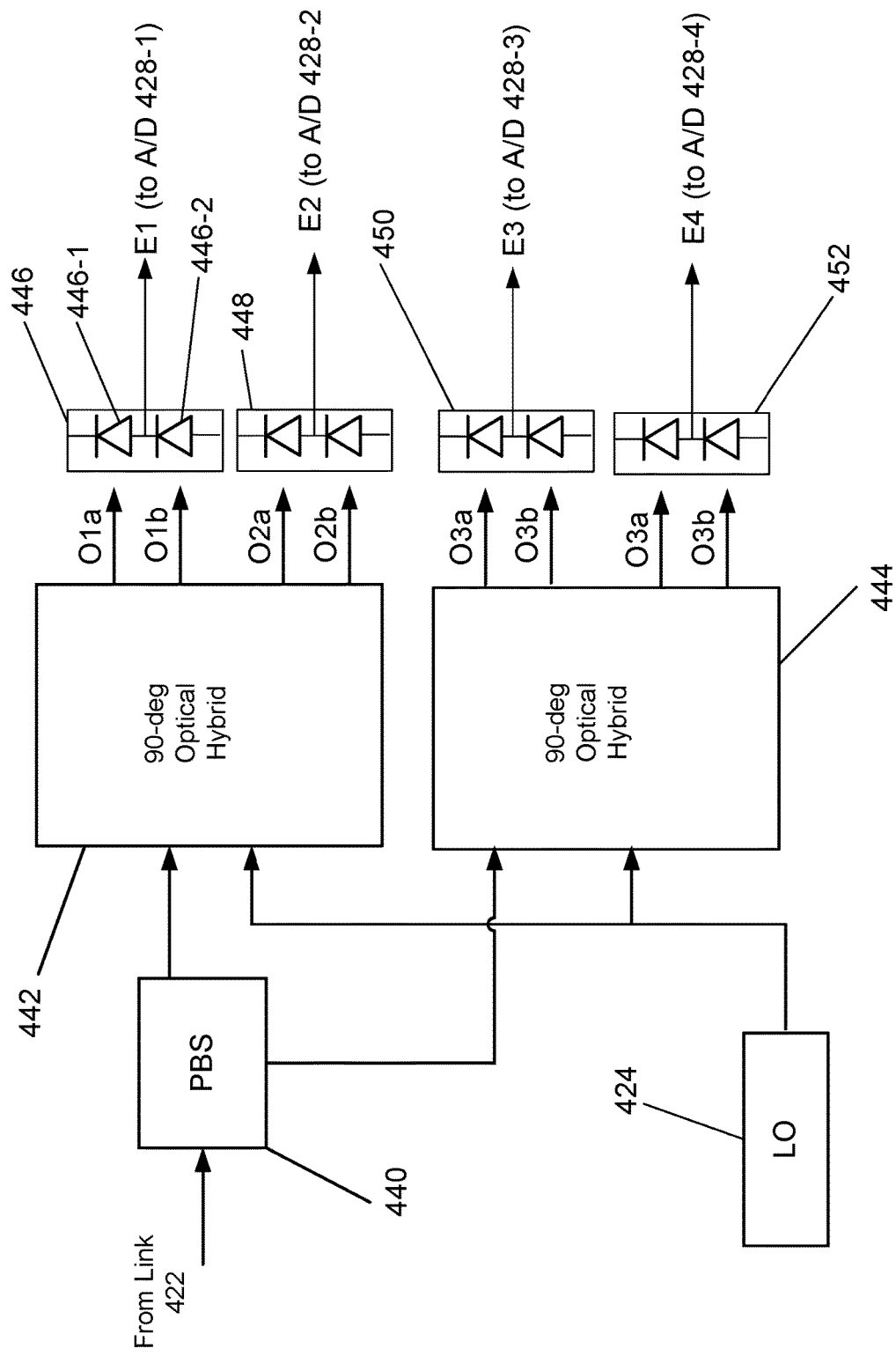
FIG. 4c illustrates a coherent receiver consistent with a further aspect of the present disclosure.

The polarization multiplexed signal next propagates along optical communication path 422, which may include one or more segments of optical fiber and one or more optical amplifiers, to coherent receiver 426, which is shown in greater detail in FIG. 4c. As shown in FIG. 4c, coherent receiver 426 may include a polarization beam splitter (PBS) 4440 operable to receive the polarization multiplexed optical signal and to separate the signal into X (TE) and Y (TM) orthogonal polarizations, i.e., vector components of the optical E-field of the incoming optical signals transmitted on optical communication path 422. The orthogonal polarizations are then mixed in 90-degree optical hybrid circuits ("hybrids") 442 and 444 with light from local oscillator (LO) laser 424 having a wavelength, for example, approximately equal to, the wavelength of the polarization multiplexed optical signal. Hybrid circuit 442 outputs, for example, four mixing products or optical signals O1a, O1b, O2a, O2b and hybrid circuit 444 outputs four optical signals or mixing products O3a, O3b, O4a, and O4b, each representing the in-phase (XI, YI) and quadrature (XQ, YQ) components of the optical E-field on the X (TE) and Y (TM) polarizations, and each including light from local oscillator 424 and light from polarization beam splitter 440. Optical signals O1a, O1b, O2a, O2b, O3a, O3b, O4a, and O4b are supplied to a respective one of photodetector circuits 446, 448, 450, and 452. Each photodetector circuit may include a pair of photodiodes (such as photodiodes 446-1 and 446-2) configured as a balanced detector, for example, and each such photodetector circuit supplies a corresponding one of electrical signals E1 (corresponding to XI), E2 (corresponding to XQ), E3 (corresponding to YI), and E4 (corresponding to YQ) to a respective one of analog-to-digital (A/D) converter circuits 428-1 to 428-4. Alternatively, each photodetector may include one photodiode (such as photodiode 446-1) or single-ended photodiode. Electrical signals E1 to E4 are indicative of data carried by the polarization multiplexed optical signal input to PBS 440. For example, these electrical signals may comprise four base-band analog electrical signals linearly proportional to the in-phase (XI, YI) and quadrature (XQ, YQ) components of the optical E-field on X and Y polarizations.

Returning to FIG. 4a, A/D converter circuits 428-1 to 428-4 convert the received XI, XQ, YI, and YQ analog signals into corresponding series of digital samples RD0 to RD3. Each series or stream of digital samples is supplied to a receiver (Rx) DSP 420, which is discussed in greater detail below. Rx DSP 430, in turn, outputs, in this example, eight streams of symbols (RI0 to RI7) carried by the polarization multiplexed optical signal to symbol to bit de-mapper circuit 434. Next, de-mapper circuit 434 outputs streams of bits or data sequences SD0 to SD7 of data, such that each sequence corresponds to a particular symbol output from Rx DSP 430. The data or bit sequences are then de-interleaved by de-interleaver circuit 436 and the de-interleaved data is the subject to FEC decoding by decoder circuit 438. The decoded output corresponding to the data or client payload input to FEC encoder 410 discussed above.

As further shown in FIG. 4, microprocessor 432 may also be provided to control overall operation of Tx DSP 416 and Rx DSP 430, for example, by placing one or both DSPs in idle mode, as well as provide alarms to a user.

Figure 5:
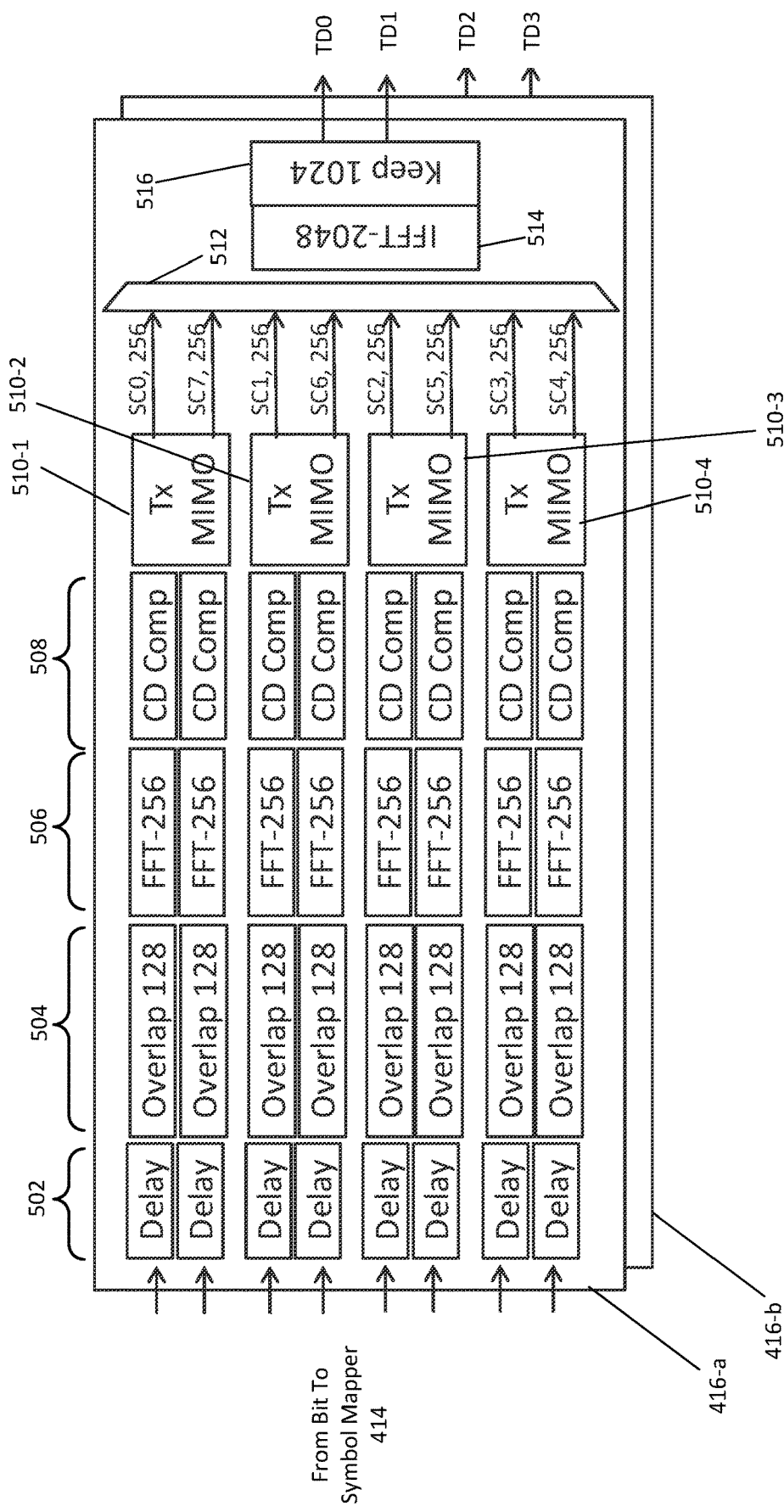
FIG. 5 illustrates a transmit side digital signal processor (DSP) consistent with an additional aspect of the present disclosure.

FIG. 5 shows the first portion (labeled 416-*a*) of Tx DSP 416 in greater detail. As noted above, DSP portion 416-*a* provides outputs TD0 and TD1 to D/A converter circuits 418-1 and 418-2, respectively, and DSP portion 416-*b* provides outputs TD2 and TD3 to D/A converter circuits 418-3 and 418-4, respectively. Although DSP portion 416-*a* is shown in detail in FIG. 5, it is understood that DSP portion 416-*b* has the same or similar structure as DSP portion 416-*a*.

DSP portion 416-*a* includes a plurality of delay circuit or buffers 502, each of which receives a corresponding one of symbol streams TD0 to TD7 from interleaver circuit 414. The delay circuits, in turn, output a respective one of these data streams to a corresponding one of overlap buffer circuits 504, each of which being configured to output a respective symbol stream, preferably without any gaps or interruptions in the such symbol stream. Overlap buffer circuits next provide a respective output to a corresponding one of fast Fourier transform (FFT) circuits 506, each of which converting the overlap buffer circuit from the time domain to the frequency domain. Such conversion to the frequency domain may advantageously consumes less power than operation in the time domain. The frequency domain outputs from the FFT circuits 506 are next subject to chromatic dispersion (CD) compensation by a respective one of circuits 508, such that resulting analog drive signals XI, XQ, YI, and YQ drive the modulators in such a way that the resulting optical signals pre-compensate for chromatic dispersion along optical communication path 422. Each of CD compensation circuits 508 may includes a respective finite-impulse response filter having a structure the same as or similar to those described below.

As further shown in FIG. 5, each of four pairs, in this example, of CD compensation circuits 508 supply outputs to a corresponding one of transmit side multiple-input multiple output (Tx MIMO) circuits 510-1 to 510-4 (collectively referred to herein as "Tx MIMO circuit 510"). In one example, the MIMO circuits disclosed herein may be 2×2 MIMO circuits. As discussed in greater detail below, each Tx MIMO circuit 510 may correct for subcarrier noise associated with the analog path variations noted above. Each Tx MIMO circuit 510 outputs pairs of data streams, each pair being associated with a corresponding pair of subcarriers. Accordingly, Tx MIMO circuit 510-1 outputs data streams SC0 and SC7 associated with corresponding subcarriers 0 and 7, noted above in FIG. 1; Tx MIMO circuit 510-2 outputs data streams SC1 and SC6 associated with corresponding subcarriers 1 and 6; Tx MIMO circuit 510-3 outputs data streams SC2 and SC5 associated with corresponding subcarriers 2 and 5; and Tx MIMO circuit 510-4 outputs data streams SC3 and SC4 associated with subcarriers 3 and 4, respectively.

As further shown in FIG. 5, data streams SC0 to SC7 are fed to multiplexer 512, which combines and supplies the data streams at a common output. The combined data streams are next fed to an inverse FFT ("IFFT") circuit 514, which converts the data streams into the time domain, and the output of the IFFT is provided to a buffer circuit 516, which supplies outputs TD0 and TD1 to D/A converter circuits 418-1 and 418-2, respectively.

DSP portion 416-*b* operates in the same or similar fashion to provide outputs TD2 and TD3 to D/A converter circuits 418-3 and 418-4, respectively.

Figure 6:
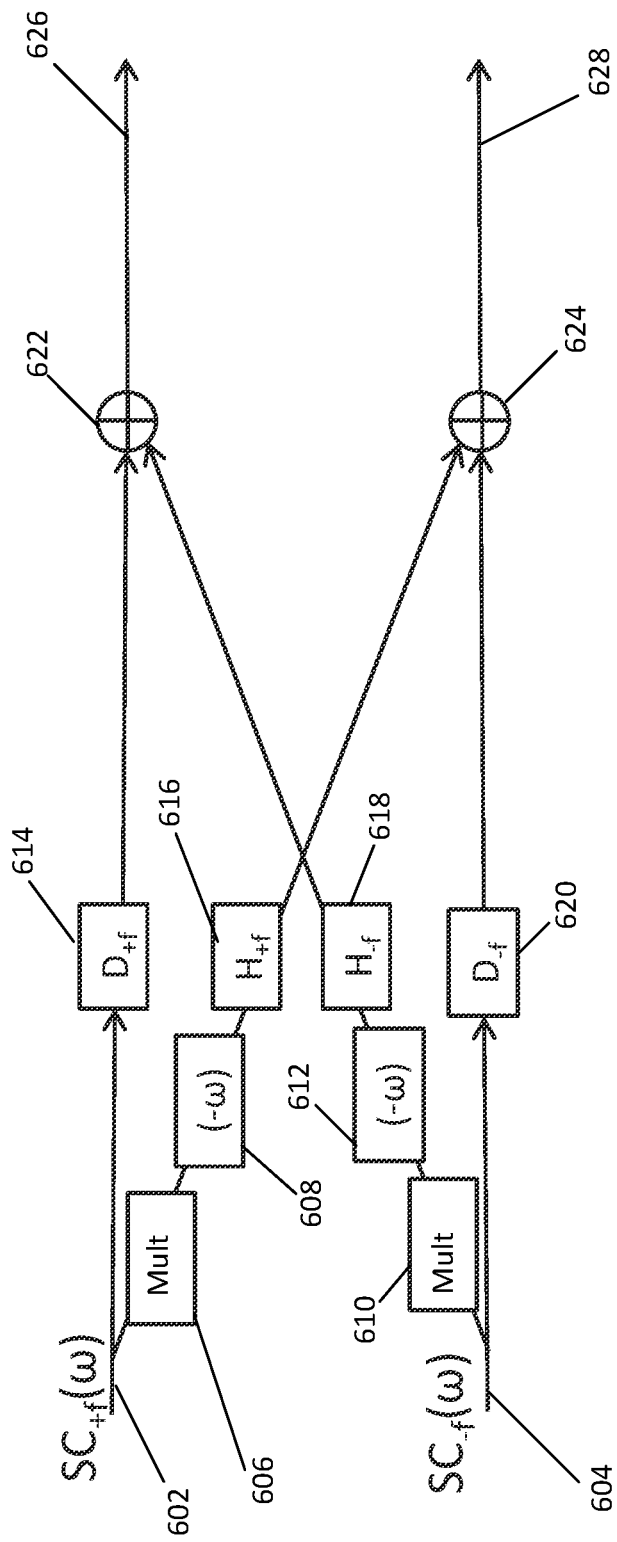
FIG. 6 illustrates an example of multiple-input multiple output (MIMO) circuit which may be included in the DSP shown in FIG. 5 consistent with an aspect of the present disclosure.

FIG. 6 shows a frequency domain implementation of one of TX MIMO circuits 510 in greater detail. It is understood that each of TX MIMO circuits 510 may have the same or similar construction and may operate in the same or similar manner. As noted above, each TX MIMO circuit 510 receives first and second (a pair) of outputs from a respective CD compensation circuit 508.

TX MIMO circuit 510 may have two inputs, 602 and 604. The first CD compensation output is associated with a first subcarrier having a frequency f ($SC_{+f}(\omega)$) and is supplied to input 602, and the second subcarrier is associated with a second subcarrier having frequency −f ($SC_{-f}(\omega)$). Accordingly, for example, TX MIMO 510-1 may receive a CD compensation output associated with subcarrier 0 (corresponding to $SC_{+f}(\omega)$ in FIG. 6) at input 602, and a CD compensation output associated with subcarrier 7 (corresponding to $SC_{-f}(\omega)$ in FIG. 6) at input 604. In addition, Tx MIMO 510-2 may receive a CD compensation output associated with subcarrier 1 (corresponding to $SC_{+f}(\omega)$ in FIG. 6) at input 602, and a CD compensation output associated with subcarrier 6 (corresponding to $SC_{-f}(\omega)$ in FIG. 6) at input 604. Further, Tx MIMO 510-3 may receive a CD compensation output associated with subcarrier 2 (corresponding to $SC_{+f}(\omega)$ in FIG. 6) at input 602, and a CD compensation output associated with subcarrier 5 (corresponding to $SC_{-f}(\omega)$ in FIG. 6) at input 604, and Tx MIMO 510-4 may receive a CD compensation output associated with subcarrier 3 (corresponding to $SC_{+f}(\omega)$ in FIG. 6) at input 602, and a CD compensation output associated with subcarrier 4 (corresponding to $SC_{-f}(\omega)$ in FIG. 6) at input 604. CD compensated subcarrier $SC_{+f}(\omega)$ is fed to filter $D_{+f}$ and is multiplied by one or more factors or parameters in circuit block 606 to output the conjugate $SC_{+f}(\omega)^*$, which is supplied to circuit block 608 that flips the frequency axis, so that for example the subcarrier conjugate at the +f frequency is treated mathematically as having the opposite −f frequency. The output of circuit block 608, therefore, is $SC_{+f}(-\omega)^*$, which is supplied to filter 616, $H_{+f}$.

As further shown in FIG. 6, CD compensated subcarrier $SC_{-f}(\omega)$ is fed filter 620, $D_{-f}$, and is multiplied by one or more factors or parameters in circuit block 610 to output the conjugate $SC_{-f}(\omega)^*$, which is supplied to circuit block 612 that flips the frequency axis, so that for example the subcarrier conjugate, as a function of frequency, ω, is treated mathematically as a function of −ω. The output of circuit block 612, therefore, is $SC_{-f}(-\omega)^*$, which is supplied to filter 618, $H_{-f}$.

The outputs of filters 614 ($D_{+f}$) and 618 ($H_{-f}$) are added or combined by circuit 622 to provide a pre-distorted first subcarrier $SC_{+f}(\omega)$, e.g., a pre-distorted subcarrier 0 having frequency f0, at output 622 of TX MIMO 510-1. In addition, the outputs of filters 616 ($H_{+f}$) and 620 ($D_{-f}$) are added or combined by circuit 624 to supply a pre-distorted second subcarrier $SC_{-f}(\omega)$, e.g., a pre-distorted subcarrier having frequency −f at output 628 of TX MIMO 510-1, for example, a pre-distorted subcarrier 7 at frequency f7 opposite frequency f0 (see FIG. 1). Similarly, pre-distorted subcarriers 1 and 6 are output from TX MIMO 510-2, pre-distorted subcarriers 2 and 5 are output from TX MIMO 510-3, and pre-distorted subcarriers 3 and 4 are output from TX MIMO 510-3.

Figure 7A:
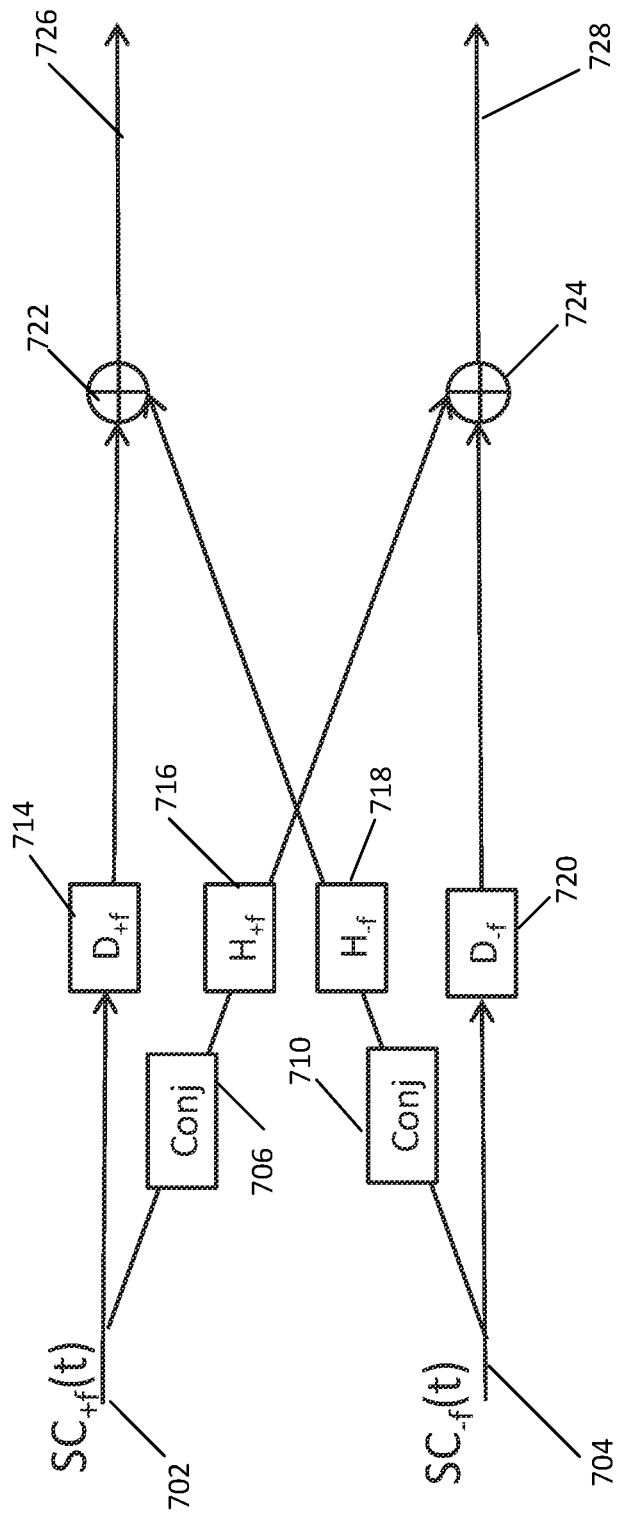
FIG. 7a another example of multiple-input multiple output (MIMO) circuit which may be included in the DSP shown in FIG. 5 consistent with an aspect of the present disclosure.

FIG. 7*a* illustrates a time domain implementation of TX MIMO 510. Here pairs of subcarriers in the time domain ($SC_{-f}(t), SC_{-f}(t)$) are input to each TX MIMO 510 instead of pairs of subcarriers in the frequency domain noted above. Also, circuit blocks 608 and 612 are omitted in FIG. 7a. Otherwise, the structure and operation of the TX MIMO 510 in FIG. 7a is similar to that discussed above in connection with FIG. 6. Namely, TX MIMO circuit 510 in FIG. 7a may have two inputs, 702 and 704. The first CD compensation output is associated with a first subcarrier having a frequency f ($SC_{+f}(t)$) and is supplied to input 702, and the second subcarrier is associated with a second subcarrier having frequency −f ($SC_{−f}(t)$). Accordingly, for example, TX MIMO 510-1 may receive a CD compensation output associated with subcarrier 0 (corresponding to $SC_{+f}(t)$ in FIG. 7a) at input 702, and a CD compensation output associated with subcarrier 7 (corresponding to $SC_{−f}(t)$ in FIG. 7a) at input 704. In addition, Tx MIMO 510-2 may receive a CD compensation output associated with subcarrier 1 (corresponding to $SC_{+f}(t)$ in FIG. 7a) at input 702, and a CD compensation output associated with subcarrier 6 (corresponding to $SC_{−f}(t)$ in FIG. 7a) at input 704. Further, Tx MIMO 510-3 may receive a CD compensation output associated with subcarrier 2 (corresponding to $SC_{+f}(t)$ in FIG. 7a) at input 602, and a CD compensation output associated with subcarrier 5 (corresponding to $SC_{−f}(t)$ in FIG. 7a) at input 704, and Tx MIMO 510-4 may receive a CD compensation output associated with subcarrier 3 (corresponding to $SC_{+f}(t)$ in FIG. 7a) at input 702, and a CD compensation output associated with subcarrier 4 (corresponding to $SC_{−f}(t)$ in FIG. 7a) at input 704. CD compensated subcarrier $SC_{+f}(t)$ is fed to finite impulse response filter (FIR) $D_{+f}$ and is convolved by circuit block 706 to output the conjugate $SC_{+f}(t)^*$, which is supplied to FIR filter 716.

As further shown in FIG. 7a, CD compensated subcarrier $SC_{−f}(t)$ is fed to finite impulse response filter (FIR) $D_{−f}$ and is convolved by circuit block 710 to output the conjugate $SC_{−f}(t)^*$, which is output to FIR filter 718, $H_{−f}$.

The outputs of FIR filters 714 and 718 are added or combined by circuit 722 to provide a pre-distorted first subcarrier $SC_{+f}(t)$, e.g., a pre-distorted subcarrier 0 having frequency f0, at output 722 of TX MIMO 510-1 and a second pre-distorted subcarrier having frequency −f at output 728 of TX MIMO 510-1, e.g., a pre-distorted subcarrier 7 at frequency f7 opposite frequency f0 (see FIG. 1). Similarly, pre-distorted subcarriers 1 and 6 are output from TX MIMO 510-2, pre-distorted subcarriers 2 and 5 are output from TX MIMO 510-3, and pre-distorted subcarriers 3 and 4 are output from TX MIMO 510-4.

An exemplary FIR filter 614 will next be described with reference to FIG. 7b. Filter 614 includes a plurality of stages 753-0 to 753-255, each of which includes a respective one of delay circuits 752-0 to 752-255 and respective one of a plurality of multipliers, such as complex multiplier circuits 751-0 to 755-255. Each of multiplier circuits multiplies a respective input to each stage 753-0 to 753-255 by a corresponding one of coefficients $d_{xx0}$ to $d_{xx255}$. The products generated by each of multiplier circuits 751-0 to 755-255 are summed by an adder circuit 758.

In operation, stage 750-0 receives subcarrier $SC_{+f}(\omega)$, which may be a complex number in the form I+jQ. In FIG. 7b, $SC_{+f}(\omega)$ is represented by $u_x(n)$, n being an integer. Multiplier circuit 751-0 multiplies the value $u_x(n)$ by coefficient $d_{xx0}$. The value is next shifted to the next stage 751-1, and, after a delay created by delay circuit 752-1, the value (now represented by $u_x(n−1)$ is multiplied by coefficient $h_{xx1}$ with multiplier circuit 752-1. In the meantime, a second input is supplied to the first stage, 750-0 and multiplied by coefficient $d_{xx0}$. Similarly, multiplier circuits in remaining stages 750-2 to 755-255 multiply the values supplied to each such circuit by a respective one of coefficients $d_{xx2}$ to $d_{xx255}$. With each shift to an adjacent stage, following a delay, which in this example is ¾ of a symbol period (T), the value input to each stage is multiplied by a respective coefficient and the resulting products are summed by adder 758 and output. Moreover, with each such shift (or less often) and multiplication, each of coefficients $d_{xx0}$ to $d_{xx255}$ is updated, as described below.

Figure 7B:
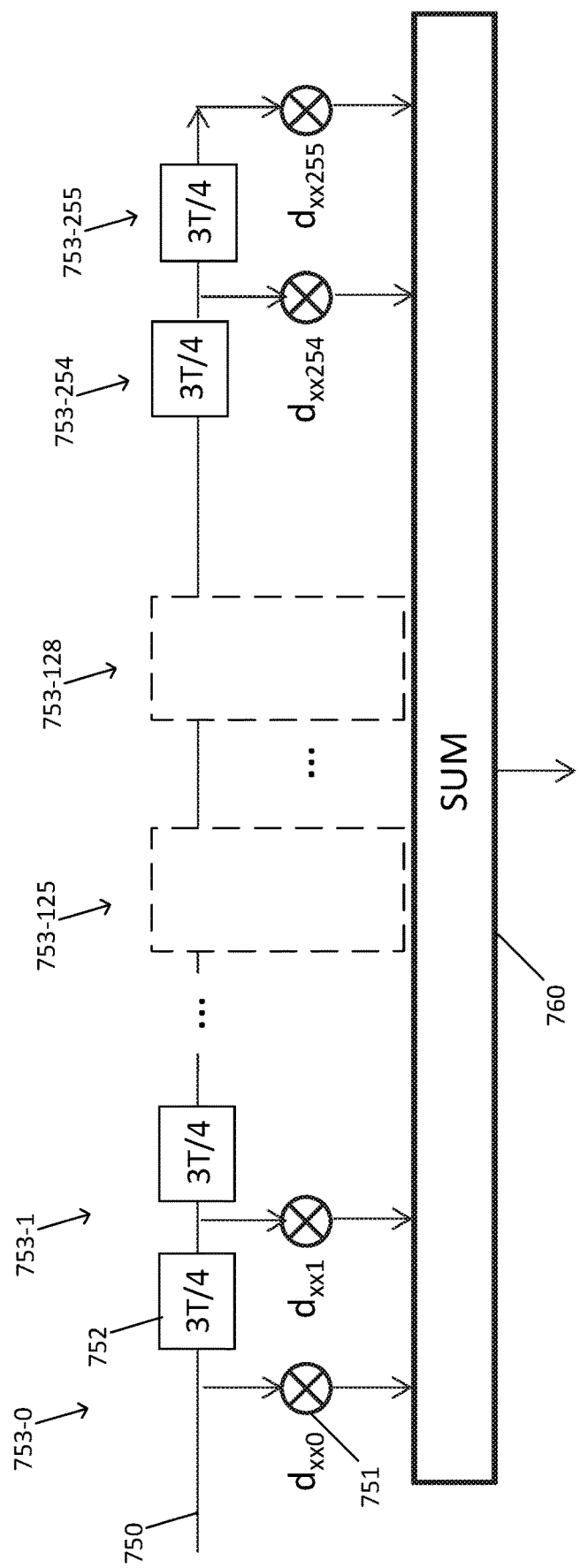
FIG. 7b shows an example of a finite impulse response (FIR) filter in accordance with a further aspect of the present disclosure.

FIR filters 616, 618, 620, 714, 716, 718, and 720 have the same or similar structure as FIR filter 614 shown in FIG. 7b to provide pre-distorted subcarriers at frequencies +f and −f, as noted above. The coefficients, however, in each of these filters, however, may differ from coefficients $d_{xx0}$ to $d_{xx255}$ described above and may be updated based on different parameters than those associated with coefficients $d_{xx0}$ to $d_{xx255}$.

Figure 8:
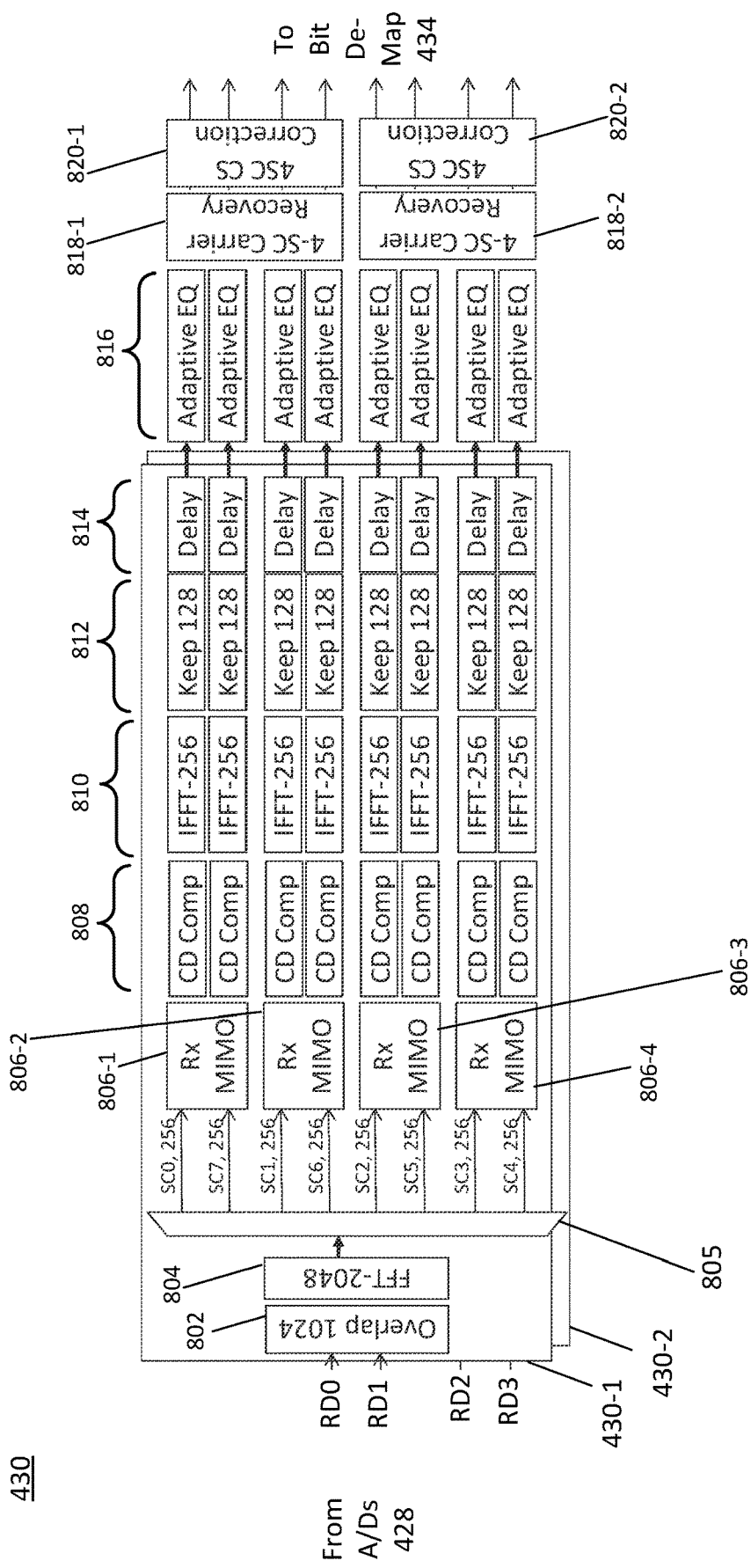
FIG. 8 illustrate a receiver side DSP consistent with an additional aspect of the present disclosure.

FIG. 8 shows RX DSP 430 of FIG. 4 in greater detail. Rx DSP 430 includes first (430-1) and second (430-2) portions. First portion 430-1 receives digital outputs form A/D circuits 418-1 and 418-2, which are associated with signals XI and XQ, respectively, and second portion 430-2 receives digital outputs from A/D circuits 418-3 and 418-4, which are associated with signal YI and YQ, respectively. DSP portion 430-1 is shown in detail in FIG. 8. DSP second portion 430-2 has the same or similar structure and operation as DSP first portion 430-1.

As shown in FIG. 8, RD0 and RD1 are input to a buffer circuit, which, is configured to supply data to FFT circuit 804, which converts the data to frequency domain data in a manner similar to that described above. The frequency domain data output from FFT circuit 804 is provided to a demultiplexer circuit 805, which has eight outputs, each of which corresponding to a respective one of subcarriers 0 to 7. Accordingly, demultiplexer 805 supplies four pairs of outputs, and each such output pair is fed to a respective one of receiver (Rx) MIMO circuit 806-1 to 806-4, which are described in greater detail below. Each Rx MIMO circuit 806-1 to 806-4, corrects or offsets the analog path distortions noted above on the receiver side. Such corrected data associated with each subcarrier is supplied to a chromatic dispersion (CD) compensating circuits 808, each of which may include an FIR circuit similar to or the same as that discussed above in connection with FIG. 7b, but with different coefficients that may be updated based on different parameters than those associated with the FIR filters discussed above. CD compensation circuits 808 correct for impairments attributable to chromatic dispersion which may occur during transmission of subcarriers 1 to 7 in optical communication path 422 in FIG. 4. The CD compensated data output from circuit 808 is next supplied to IFFT circuits 810 which convert the received data into time domain data. As noted above CD compensation and correction for analog distortions consumes less power when operating on frequency domain data, as opposed to time domain data. Accordingly, FFT circuit 804 is provided to provide frequency domain data in a manner similar to that described above with respect to FFT circuit 506 shown in FIG. 5.

The outputs of IFFT circuit 810 are supplied to a first buffer circuits 812, which in turn, supplies the outputs to a delay circuit or second buffer circuits 814. The outputs of the second buffer circuits—eight such outputs in this example, each of which corresponding to a respective one of subcarriers 0 to 7—are supplied to a respective one of adaptive equalizer circuits 816 which correct for polarization mode dispersion (PMD). Each such adaptive equalizer circuit may further include an FIR filter have the same or similar structure as those described above, but with different coefficients that are updated based on different parameters than those associated with the FIR filters noted above. As shown in FIG. 8, a first group of four adaptive equalizer outputs is fed to a first carrier recovery circuit 818-1 and a second group of four adaptive equalizer circuit outputs is fed to a second carrier recovery circuit 818-2. Carrier recovery circuits 818-1 and 818-2 determine the phase of each of subcarriers 0 to 7. Further corrections to the phase data are made in circuits 820-1 and 820-2, which, collectively, supply outputs RI0 to RI7 to symbol-to-bit de-mapper 434 shown in FIG. 4.

Figure 9:
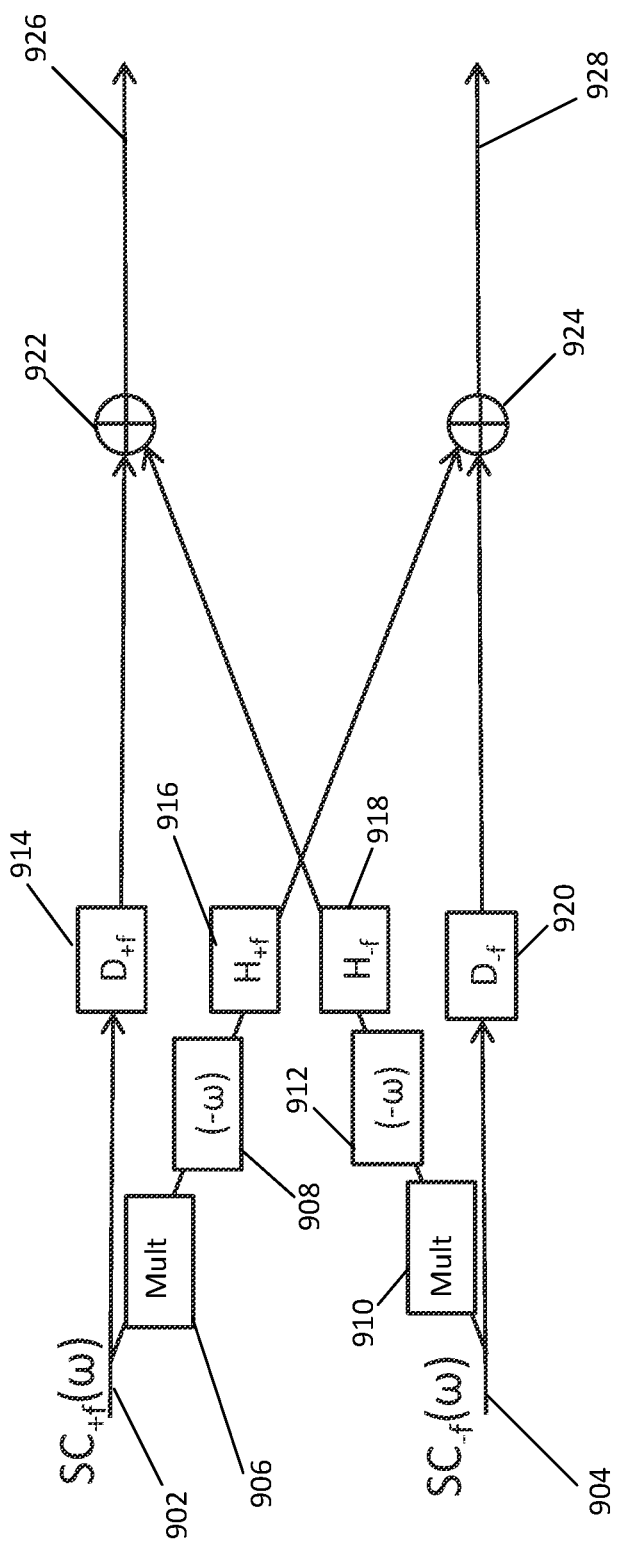
FIG. 9 shows an example of a MIMO circuit, which may be included in the DSP shown in FIG. 8 in accordance with an aspect of the present disclosure.

FIG. 9 shows Rx MIMO circuit 806-1 in greater detail. Rx MIMO circuits 806-2 to 806-4 may have the same or similar structure and operate in a similar fashion as Rx MIMO 806-1. In addition, Rx MIMO 806-1, as well as Rx MIMO circuits 806-2 to 806-4 may have the same structure and operate in the same or similar manner as Tx MIMO circuits 510 discussed above with reference to FIG. 6. Namely, a first subcarrier having a frequency f ($SC_{+f}(\omega)$) output from demultiplexer 805 is supplied to input 902, and a second subcarrier is associated with a second subcarrier having frequency −f ($SC_{-f}(\omega)$) from demultiplexer 805 is supplied to input 904. Accordingly, for example, Rx MIMO 806-1 may receive an output associated with subcarrier 0 (corresponding to $SC_{+f}(\omega)$) at input 902, and an output associated with subcarrier 7 (corresponding to $SC_{-f}(\omega)$) at input 904. In addition, Rx MIMO 806-2 may receive an output associated with subcarrier 1 (corresponding to $SC_{+f}(\omega)$) at input 902, and an output associated with subcarrier 6 (corresponding to $SC_{-f}(\omega)$) at input 904. Further, Rx MIMO 806-3 may receive an output associated with subcarrier 2 (corresponding to $SC_{+f}(\omega)$) at input 902, and an output associated with subcarrier 5 (corresponding to $SC_{-f}(\omega)$) at input 904, and Rx MIMO 806-4 may receive an output associated with subcarrier 3 (corresponding to $SC_{+f}(\omega)$) at input 902, and an output associated with subcarrier 4 (corresponding to $SC_{-f}(\omega)$) at input 904. Subcarrier $SC_{+f}(\omega)$ is fed to filter $D_{+f}$ and is multiplied via circuit block 906 to output the conjugate $SC_{+f}(\omega)^*$, which is supplied to circuit block 908 that flips the frequency axis, so that for example the subcarrier conjugate at frequency ω is treated mathematically as having the opposite frequency −ω. The output of circuit block 908, therefore, is $SC_{+f}(-\omega)^*$, which is supplied to filter 916, $H_{+f}$.

As further shown in FIG. 9, subcarrier $SC_{-f}(\omega)$ is fed to filter 920, $D_{-f}$, and is multiplied via circuit block 910 to output the conjugate $SC_{-f}(\omega)^*$, which is supplied to circuit block 912 that flips the frequency axis, so that for example the subcarrier conjugate, as a function of frequency, co, is treated mathematically as a function of −ω. The output of circuit block 912, therefore, is $SC_{-f}(-\omega)^*$, which is supplied to filter 918, $H_{-f}$.

The outputs of filters 914 ($D_{+f}$) and 918 ($H_{-f}$) are added or combined by circuit 922 to provide a compensated or corrected first subcarrier $SC_{+f}(\omega)$, e.g., subcarrier 0 having frequency f0, which has been corrected or compensated for the analog distortions noted above, at output 922 of Rx MIMO 806-1. In addition, the outputs of filters 916 ($H_{+f}$) and 920 ($D_{-f}$) are added or combined by circuit 924 to supply a corrected second subcarrier $SC_{-f}(\omega)$, e.g., a similarly corrected or compensated subcarrier having frequency −f at output 928 of Rx MIMO 806-1, for example, subcarrier 7 at frequency f7 opposite frequency f0 (see FIG. 1). Likewise, corrected subcarriers 1 and 6 are output from Rx MIMO 806-2, corrected subcarriers 2 and 5 are output from Rx MIMO 806-3, and corrected subcarriers 3 and 4 are output from Rx MIMO 806-4.

Filters 914, 916, 918, and 920 have the same or similar structure and operate in a similar fashion as filter 714, for example, which is discussed above with reference to FIG. 7a. filters 914, 916, 918, and 920 may have similar stages, each of which including multiplier circuits that multiply input subcarrier data by a respective coefficient. Updating such coefficients in both the Rx and Tx MIMOs is further described below.

In on example, in the time domain, the formula for updating FIR coefficients is given by:

$$h_{Tx \ or \ Rx}^m[n] = h_{Tx \ or \ Rx}^{m-1}[n] + \mu \cdot err_{inv} \cdot s[n] \qquad \text{Eq. 1}$$

Where $h_{Tx \ or \ Rx}^m[n]$ is the updated coefficient in an FIR filter in either the Tx or Rx MIMO, $h_{Tx \ or \ Rx}^m[n]$ is the current coefficient in an FIR filter in either the Tx or Rx MIMO, μ is a constant, $err_{inv}$ is an error parameter, which is the difference between a desired signal value and s[n] is the received signal and is used to update filter coefficients in the. The error parameter may be different in the Tx and Rx MIMO and may also be calculated differently for each such MIMO. It is noted that each of the above parameters corresponds to a vector having n components. In the above example shown in FIG. 7b, n=0 . . . 255, and s[n] corresponds to the values input to each stage 753-0 to 753-255.

Preferably, in the Tx MIMO, the error parameter ($err_{inv}$) is determined by identifying an approximate value (S') of the subcarrier-related symbol data S, which corresponds to symbol data TI0 to TI7 input to Tx DSP 416, and received data or the detected version of the optical signal (R) output from the carrier recovery circuits 818-1 and 818-2. The overall error (err) is thus:

$$err = S' - R \qquad \text{Eq 2.}$$

For the coefficients of the FIR filters in the Tx MIMO, Eq. 1 above is expressed as:

$$h_{Tx}^m[n] = h_{Tx}^{m-1}[n] + \mu \cdot err_{inv} \cdot s[n] \qquad \text{Eq. 3}$$

The error term $err_{inv}$ in Eq. 3 may be expressed in terms of the overall err, as follows:

$$err_{inv} = (Tx_{RF} \cdot Fiber \cdot Rx_{RF} \cdot Rx_{RFcomp} \cdot Rx_{eq})^{-1} \cdot err \qquad \text{Eq. 4}$$

where $Tx_{RF}$ corresponds to the analog distortions noted above, Fiber is associated with impairments, such as PMD and CD that occur during transmission over optical communication path 422 in FIG. 4, $Rx_{RF}$ corresponds to the analog path distortions in the receiver noted above, $Rx_{RFcomp}$ corresponds to the correction of such distortions provided by the RF MIMOs 806-1 to 806-4, and $Rx_{eq}$ corresponds to the offset or correction of the fiber impairments noted above. Since $Rx_{eq}$ offsets the impairments associated with the Fiber term in Eq. 4, and, further the $Rx_{RFcomp}$ offsets the distortions associated with the $Rx_{RF}$ term, each of terms Fiber, $Rx_{RF}$, $Rx_{RFcomp}$, and $Rx_{eq}$ cancel out, such that $err_{inv} \approx Tx_{RF}^{-1} \cdot err$. Consistent with a least mean squares (LMS) technique, the coefficients in each of the TX MIMO FIR filters are updated so that $err_{inv}$ is reduced or minimized.

In the Rx MIMO, coefficients are updated based on Eq. 5:

$$h_{Tx}^m[n] = h_{Tx}^{m-1}[n] + \mu \cdot err_{inv} \cdot s[n] \qquad \text{Eq. 5}$$

Here, however, the error term $err_{inv}$ satisfies Eq. 6:

$$err_{inv}[n] = Rx_{eq}^{-1}[n - d_{eq} - d_{cpr}] \cdot Rx_{cpr}^{-1}[n - d_{cpr}] \cdot err[n] \qquad \text{Eq. 6}$$

Where $d_{eq}$ and $d_{cpr}$ are the coefficients associated with the FIR filters of the adaptive equalizer circuits 416 and carrier recovery circuits 818, respectively, and n is an index term having values of 0 to 255 in the present example. In addition, $Rx_{eq}$ corresponds to the correction provided by equalizer circuit circuits 416, and Rx$_{cpr}$ corresponds to the phase recovered by carrier recovery circuits 818. As in the Tx MIMO, an LMS technique may be employed to update the coefficients in each of the RX MIMO FIR filters so that err$_{inv}$ is reduced or minimized.

Preferably, in connection with Eq. 6, "snapshots" or samples of the error, err, and data output from equalizers 816 and carrier recovery circuits 818 are synchronized that the error sample and data samples are associated with the correct tap update. Accordingly, if a group of symbols arrived at t time T, then such symbols will arrive at the input of carrier recovery circuits 818 at time T+deq (where deq is the delay associated with adaptive equalizer 816), and arrive at output of carrier recovery circuit 818, where the data "snapshot" at time T+dcr+deq is taken. In one example, programmable delays are provided in the Rx DSP so that these delays may be matched at a particular time and associated with the desired coefficient update.

It is noted that the coefficients of the FIR filters in the Tx/Rx MIMOs and the coefficients in the FIR filters in equalizer circuits 416 may be updated to less than optimal values, because the coefficients of each FIR filter are active in the same system and there may be multiple solutions for which the updated coefficients may satisfy. The updated coefficients may thus deviate to values that do not minimize the erri$_{nv}$ term. Consistent with a further aspect of the present disclosure optimal coefficient updates are obtained by updating each of the coefficients in FIR filter associated with –f subcarriers (such as subcarriers having frequencies to the left of or less than laser frequency fL in FIG. 1), e.g. FIR filters 620 (D$_{-f}$) in FIG. 6, and 720 (D$_{-f}$) in FIG. 7a, and 920 (D$_{-f}$) in FIG. 9. However, selected coefficients remain fixed or not updated in FIR filters associated +f subcarriers (such as subcarriers having frequencies to the right of or greater than laser frequency fL in FIG. 1), e.g. FIR filters 616 (H$_{+f}$) and 614 (D$_{+f}$) in FIG. 6, FIR filters 616 (H$_{+f}$) and 614 (D$_{+f}$) in FIG. 7a, and FIR filters 916 (H$_{+f}$) and 914 (D$_{+f}$) in FIG. 9. In one example, the not updated coefficients are associated with centrally located stages in the FIR filter, such as, for example, coefficients associated with stages 755-125 to 755-129 of and corresponding multiplier circuits of FIR filter 614 (see FIG. 7). Preferably, such centrally located stages have the same or substantially the same number of stages with indexes less than and greater than the indexes than the centrally located stages, and such stages other than the centrally located stages have associated coefficients which are updated, as noted above.

Other embodiments will be apparent to those skilled in the art from consideration of the specification. It is intended that the specification and examples be considered as exemplary only, with a true scope and spirit of the invention being indicated by the following claims.

What is claimed is:

1. An apparatus, comprising:
   analog circuitry including first and second paths for carrying electrical signals associated with in-phase and quadrature components of an optical signal; and
   a digital signal processor including digital circuitry that corrects for impairments that would occur in the optical signal in the absence of the digital circuitry, the impairments being associated with at least a difference in a characteristic between the first and second paths, wherein the optical signal includes a plurality of subcarriers, and
   wherein each of the plurality of subcarriers has a corresponding one of a plurality of first frequencies, one of the plurality of subcarriers having one of the plurality of first frequencies that is greater than a second frequency, and another one of the plurality of subcarriers having another one of the plurality of first frequencies that is less than the second frequency, the impairments being associated with an image of said one of the plurality of subcarriers at said another one of the plurality of first frequencies.

2. An apparatus in accordance with claim 1, wherein the digital circuitry includes a multiple-input, multiple-output (MIMO) circuit.

3. An apparatus in accordance with claim 2, wherein the MIMO circuit includes a plurality of finite impulse response (FIR) filters.

4. An apparatus in accordance with claim 3, wherein each of the plurality stages includes a respective one of a plurality of delay circuits and a corresponding one of a plurality of multiplier circuits, whereby each of the plurality of multiplier circuits multiplies an input to each of the plurality of stages by a respective one of a plurality of coefficients.

5. An apparatus in accordance with claim 4, wherein each of the plurality of coefficients is variable.

6. An apparatus in accordance with claim 1, further including a modulator, the optical signal being output from the modulator.

7. An apparatus in accordance with claim 6, further including a laser that supplies to the modulator, wherein the modulator modulates the light to provide the optical signal.

8. An apparatus in accordance with claim 7, wherein the modulator including a Mach-Zehnder interferometer.

9. An apparatus, comprising:
   a laser that supplies light;
   a modulator circuit, the modulator circuit receiving the light from the laser;
   a digital-to-analog circuit that supplies a drive signal to the modulator circuit, the modulator circuit modulating the light to provide an optical signal that includes in-phase and quadrature components, the digital-to-analog circuit including first and second paths that carry electrical signals associated with the in-phase and quadrature components of the optical signal; and
   a digital signal processor that provides a digital signal to the digital-to-analog circuit, the digital signal processor including circuitry that corrects for impairments that would occur in the optical signal in the absence of the circuitry, the impairments being associated with at least a difference in a characteristic between the first and second paths,
   wherein the optical signal includes a plurality of subcarriers, and
   wherein each of the plurality of subcarriers has a corresponding one of a plurality of first frequencies, one of the plurality of subcarriers having one of the plurality of first frequencies, said one of the plurality of first frequencies being is greater than a second frequency, and another one of the plurality of subcarriers having another one of the plurality of first frequencies, said one of the plurality of second frequencies being is less than the second frequency, the impairments being associated with an image of said one of the plurality of subcarriers at said another one of the plurality of first frequencies, the second frequency corresponding to a frequency of the light from the laser and received by the modulator.

10. An apparatus in accordance with claim 9, wherein the circuitry in the digital signal processor includes a multiple-input, multiple- output (MIMO) circuit.

11. An apparatus in accordance with claim 10, wherein the MIMO circuit includes a finite impulse response (FIR) filter, which includes a plurality of stages.

12. An apparatus in accordance with claim 11, wherein each of the plurality stages includes a respective one of a plurality of delay circuits and a corresponding one of a plurality of multiplier circuits, whereby each of the plurality of multiplier circuits multiplies an input to each of the plurality of stages by a respective one of a plurality of coefficients.

13. An apparatus, comprising:
a laser that supplies light;
a modulator circuit, the modulator circuit receiving the light from the laser;
a digital-to-analog circuit that supplies a drive signal to the modulator circuit, the modulator circuit modulating the light to provide an optical signal that includes in-phase and quadrature components, the digital-to-analog circuit including first and second paths that carry electrical signals associated with the in-phase and quadrature components of the optical signal;
a digital signal processor that provides a digital signal to the digital-to-analog circuit, the digital signal processor including circuitry that corrects for impairments that would occur in the optical signal in the absence of the circuitry, the impairments being associated with at least a difference in a characteristic between the first and second paths,
wherein the optical signal includes a plurality of subcarriers,
wherein the circuitry in the digital signal processor includes a multiple-input, multiple-output (MIMO) circuit
wherein the MIMO circuit includes a finite impulse response (FIR) filter, which includes a plurality of stages,
wherein each of the plurality stages includes a respective one of a plurality of delay circuits and a corresponding one of a plurality of multiplier circuits, whereby each of the plurality of multiplier circuits multiplies an input to each of the plurality of stages by a respective one of a plurality of coefficients, and
wherein each of a plurality of first values is associated with a corresponding one of the plurality of coefficients, each of the plurality of first values being changed to a corresponding one of second values, based on a detected version of the optical signal at a receiver.

14. An apparatus, comprising:
a coherent receiver that receives an optical signal having in-phase and quadrature components;
an analog-to-digital circuit that receives an analog signal from the coherent receiver, the digital-to-analog circuit including first and second paths that carry electrical signals associated with the in-phase and quadrature components of the optical signal;
a digital signal processor that receives a digital signal from the analog-to-digital conversion circuit, the digital signal processor including circuitry that corrects for impairments that would occur in the digital signal in the absence of the circuitry, the impairments being associated with at least a difference in a characteristic between the first and second paths,
wherein the optical signal includes a plurality of subcarriers,
wherein each of the plurality of subcarriers has a corresponding one of a plurality of first frequencies, one of the plurality of subcarriers having one of the plurality of first frequencies, said one of the plurality of first frequencies being is greater than a second frequency, and another one of the plurality of subcarriers having another one of the plurality of first frequencies, said one of the plurality of second frequencies being is less than the second frequency, the impairments being an image of said one of the plurality of subcarriers at said another one of the plurality of first frequencies, the second frequency corresponding to a frequency of the light from the laser and received by the modulator.

15. An apparatus in accordance with claim 14, wherein the circuitry of the digital signal processor includes a multiple-input, multiple-output (MIMO) circuit.

16. An apparatus in accordance with claim 15, wherein the MIMO circuit includes a finite impulse response (FIR) filter, which includes a plurality of stages.

17. An apparatus in accordance with claim 16, wherein each of the plurality stages includes a respective one of a plurality of delay circuits and a corresponding one of a plurality of multiplier circuits, whereby each of the plurality of multiplier circuits multiplies an input to each of the plurality of stages by a respective one of a plurality of coefficients.

18. An apparatus in accordance with claim 14, further including a transmitter that supplies the optical signal to an optical communication link, the receiver being coupled to the optical communication link.

19. An apparatus in accordance with claim 18, wherein the digital signal processor is a first digital signal processor, the transmitter includes:
a laser that supplies light;
a modulator circuit, the modulator circuit receiving the light from the laser;
a digital-to-analog circuit that supplies a drive signal to the modulator circuit, the modulator circuit modulating the light to provide the optical signal, the digital-to-analog circuit including first and second paths that carry electrical signals associated with the in-phase and quadrature components of the optical signal;
a second digital signal processor that supplies a digital signal to the digital-to-analog circuit, the digital signal processor including circuitry that corrects for impairments that would occur in the optical signal in the absence of the circuitry, the impairments in the optical signal being associated with at least a difference in a characteristic between the first and second paths in the digital-analog-circuit.

* * * * *